(12) United States Patent
Kakoschke et al.

(10) Patent No.: US 7,582,546 B2
(45) Date of Patent: Sep. 1, 2009

(54) DEVICE WITH DAMAGED BREAKDOWN LAYER

(75) Inventors: Ronald Kakoschke, Munich (DE); Thomas Nirschl, Essex Junction, VT (US)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 11/696,754

(22) Filed: Apr. 5, 2007

(65) Prior Publication Data

US 2008/0246016 A1 Oct. 9, 2008

(51) Int. Cl.
*H01L 21/425* (2006.01)
*H01L 47/00* (2006.01)

(52) U.S. Cl. .............. 438/526; 438/373; 438/462; 438/900; 257/3; 257/4; 257/E29.284

(58) Field of Classification Search .............. None
See application file for complete search history.

(56) References Cited

U.S. PATENT DOCUMENTS 7,459,762 B2 * 12/2008 Kostylev et al. .............. 257/529

2005/0032319 A1 * 2/2005 Dodge .............. 438/293
2006/0171194 A1 * 8/2006 Lowrey et al. .............. 365/154

OTHER PUBLICATIONS

S.J. Ahn et al, Highly Reliable 50nm Contact Cell Terminology for 256Mb PRAM, Symposium on VLSI Technology Digest of Technical Papers, 2005, pp. 98-99, 4-9000784-00-1.
M. Gill et al, Ovonic Unified Memory—A High-Performance Non-volatile Memory Technology for Stand-Alone Memory and Embedded Applications, IEEE International Solid-State Circuits Conference, Feb. 5, 2002, 0-7803-7335-5.
Happ et al, Novel One-Mask Self-Heating Pillar Phase Change Memory, Symposium on VLSI Technology Digest of Technical Papers, 2006, 1-4244-0005-8/06.

* cited by examiner

*Primary Examiner*—Evan Pert
*Assistant Examiner*—Scott R Wilson
(74) *Attorney, Agent, or Firm*—Philip H. Schlazer (57) ABSTRACT

A device utilizing a breakdown layer in combination with a programmable resistance material, a phase-change material or a threshold switching material. The breakdown layer having damage.

44 Claims, 11 Drawing Sheets

DEVICE WITH DAMAGED BREAKDOWN LAYER

FIELD OF THE INVENTION

Embodiments described herein relate generally to semiconductor devices and more particularly, to devices utilizing programmable resistance materials, phase-change materials or threshold switching materials.

BACKGROUND OF THE INVENTION

Programmable resistance elements may be formed from materials that can be programmed to exhibit at least a first and a second stable ohmic state. Such programmable resistance elements may be programmed to a first resistance state to store, for example, a logic ONE data bit or programmed to a second resistance state to store a logic ZERO data bit.

Programmable resistance elements may, for example, be formed from phase-change materials. Certain phase-change materials (for example, certain chalcogenide materials) are capable of being electrically programmed between a first structural state where, for example, the material is generally in an amorphous condition and a second structural state where, for example, the material is generally in a crystalline condition. The phase-change material exhibits different electrical characteristics depending upon its structural state. For instance, in a crystalline, more ordered, state the material exhibits a lower electrical resistivity than in an amorphous, less ordered state.

SUMMARY OF THE INVENTION

An embodiment of the present invention is a method, comprising: forming a conductive material; forming a phase-change material; forming a breakdown layer, the breakdown layer being between the conductive material and the phase-change material; and damaging the breakdown layer using an ion implantation process.

An embodiment of the present invention is a method, comprising: forming a conductive material; forming a chalcogenide material; forming a breakdown layer, the breakdown layer being between the conductive material and the chalcogenide material; and damaging the breakdown layer using an ion implantation process.

An embodiment of the present invention is a device, comprising: a conductive layer; a phase-change material; and a breakdown layer between with the phase-change material and the second conductive layer, the dielectric having ion implantation damage.

An embodiment of the present is a device, comprising: a conductive layer; a threshold switching material; and a breakdown layer between with the threshold switching material and the second conductive layer, the breakdown layer having ion implantation damage.

An embodiment of the present invention is a device, comprising: a first conductive layer; a second conductive layer; a programmable resistance material; and a breakdown layer in series with the programmable resistance material between the first conductive material and the second conductive material, the breakdown material having ion implantation damage.

DETAILED DESCRIPTION OF THE INVENTION

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Figure 1:
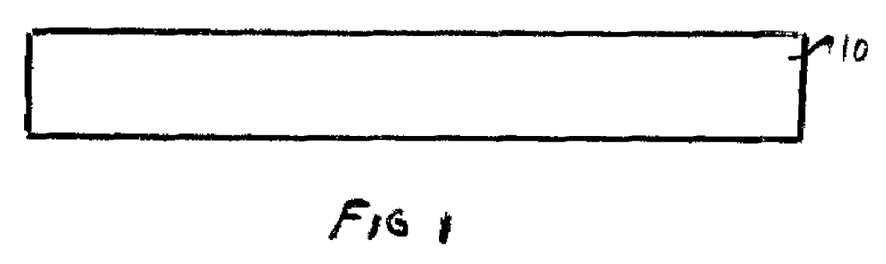
FIGS. 1 through 9 are cross-sectional views showing steps in the manufacturing of an embodiment of a phase-change element of the present invention.

FIGS. 1 through 9 provide an example of a method of making an embodiment of a phase-change element of the present invention. FIG. 1 shows a semiconductor substrate 10. The substrate may be any substrate known in the art. The substrate may be a silicon substrate or other suitable substrate. The substrate may be a silicon-on-insulator (SOI) substrate. The SOI substrate may, for example, be formed by a SIMOX process. The substrate may be a silicon-on-sapphire (SOS) substrate.

Figure 2:
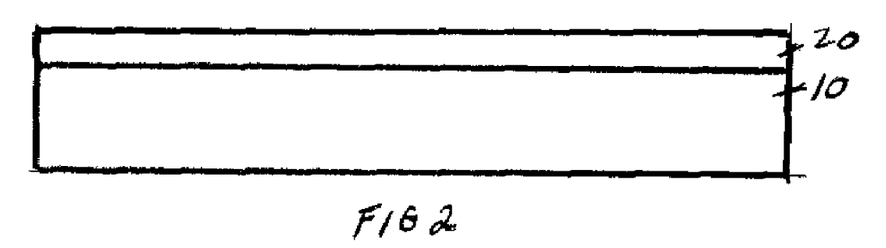

Referring to FIG. 2, a conductive layer 20 is deposited over the semiconductor substrate. Generally, the conductive layer 20 may be formed of any conductive material. Examples of materials which may be used to form conductive layer 20 include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon. The conductive layer 20 may form a first electrode for the phase-change element. In one or more embodiments of the invention, the phase-change element may be used as a memory element. The first electrode may also be referred to in the art as a first electrical contact.

Figure 3:
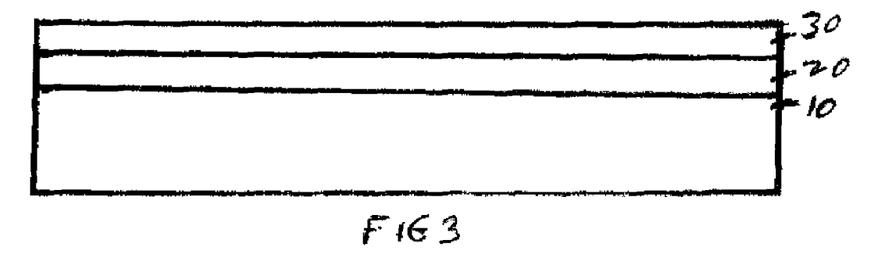

Referring to FIG. 3, a breakdown layer 30 is formed over the conductive layer 20. The breakdown layer may be a dielectric layer formed of one or more dielectric materials. For example, the breakdown layer may comprise one or more dielectric materials such as an oxide, a nitride, a oxynitride or a combination thereof. The oxide may, for example, be an oxide of aluminum or an oxide of silicon (such as silicon dioxide). Examples of oxides include $SiO_2$, $Si_3O_4$ and $Al_2O_3$. The nitride may, for example, be a nitride of aluminum or a nitride of silicon. The nitride may be a silicon nitride. The breakdown layer 30 may be formed of an amorphous silicon material. The breakdown layer 30 may be formed of a doped amorphous silicon alloy. In one embodiment, the breakdown layer may be a formed of a material comprising the elements silicon, nitrogen and hydrogen. In another embodiment, the breakdown layer may be formed of a material comprising, in atomic percent, between about 30-40% silicon, 40-50% nitrogen and up to 30% hydrogen.

The thickness of the breakdown layer is not limited to any particular thickness. In one or more embodiments, the breakdown layer may have a thickness which is less than about 200 Angstroms. In one or more embodiments, the breakdown layer may have a thickness which is less than about 100 Angstroms. In one or more embodiments, the breakdown layer may have a thickness which is less that about 60 Angstroms. In one or more embodiments, the breakdown layer may have a thickness which is between about 10 Angstroms and about 200 Angstroms. In one or more embodiments, the breakdown layer may have a thickness which is between about 20 Angstroms and about 100 Angstroms. In one or more embodiments, the breakdown layer may have a thickness which is between about 40 Angstroms and about 60 Angstroms. In one or more embodiments, the breakdown layer may have a thickness of about 50 Angstroms. The thickness of the breakdown layer used may vary depending upon the selection of operating power supply range.

In one or more embodiments of the invention, the material used for the breakdown layer as well as the thickness of the breakdown layer may be chosen so that the breakdown voltage $V_B$ across the breakdown layer may be about 10 volts or less. In another embodiment of the invention, the material used for the breakdown layer as well as the thickness of the breakdown layer may be chosen so that the breakdown voltage across the breakdown layer may be about 6 volts or less. The breakdown voltage chosen may depend on the operating power supply as well as the programming voltage used. In one or more embodiments of the invention, the material for the breakdown layer as well as the thickness of the breakdown layer may be chosen so that the breakdown layer may have a resistance of about 20,000 ohms or less after the breakdown layer is broken down.

In one or more embodiments of the invention, the breakdown layer may have a high melting point and a low chemical reactivity. In one or more embodiments of the invention, the resistivity of the breakdown layer may be between about $10^{12}$ to about $10^{17}$ ohm-cm.

Figure 4:
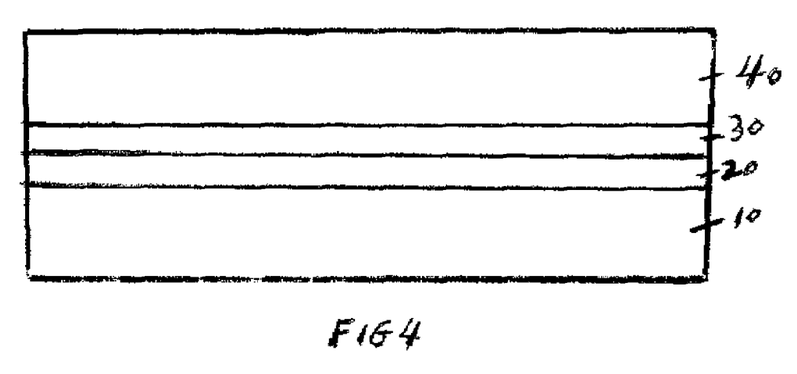

Referring to FIG. 4, a dielectric layer 40 is formed over the breakdown layer 30. The dielectric layer 40 may be formed of one or more of any dielectric materials. The dielectric layer 40 may, for example, comprise an oxide and/or a nitride. The oxide may be silicon dioxide. The nitride may be silicon dioxide. The dielectric material may be an oxynitride.

Figure 5:
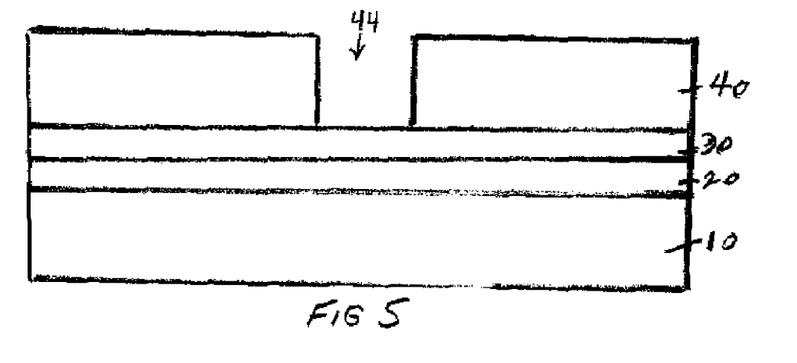

Referring to FIG. 5, the structure shown in FIG. 4 is masked and etched to form the opening 44 in the dielectric layer 40. The opening 44 may be formed by a standard photolithographic process. In the embodiment shown, the opening 44 is a hole. The hole is not limited to any particular shape and may, for example, be a round hole or a square hole. In other embodiments of the invention, the opening may, for example, be a trench. In the embodiment shown, the opening 44 is preferably formed so as to expose the breakdown layer 30. However, it is conceivable that, in other embodiments of the invention, this is not the case.

Figure 6:
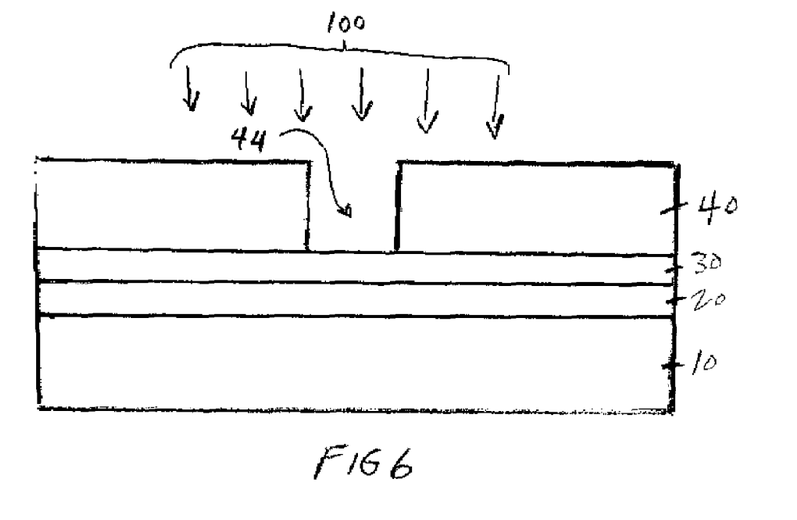

Referring to FIG. 6, after the opening 44 is formed in the dielectric layer 40, an ion implantation process 100 is used to bombard the exposed portion of the breakdown layer with at least one species. The ion implantation species preferably penetrates the breakdown layer. As the species penetrates the breakdown layer, it may slow down due to, for example, nuclear and/or electronic stopping. At least a portion of the species may become embedded within the breakdown layer. Likewise, at least a portion of the species may pass through the breakdown layer.

It is possible that the species breaks apart upon striking the breakdown layer. In this case, one or more of the components of the species may become embedded within the breakdown layer. Likewise, one or more of the components of the species may pass through the breakdown layer.

The ion implantation species may, for example, be in the form of atoms. Also, ion implantation species may, for example, be in the form of molecules. The atoms and molecules are may be in the form of ions. Two or more different species may be used.

An example of an ion implantation species is germanium atoms. The germanium atoms may be in the form of ions. The germanium ions may be accelerated toward the exposed portion of the breakdown layer and be implanted into the breakdown layer by an ion implantation process. Other examples of species include atoms (e.g. ions) of arsenic and antimony. In one of more embodiments of the invention the species may have a atomic weight which is greater than or equal to that of germanium. In one or more embodiments of the invention, the species may have an atomic weight which is greater than or equal to that of arsenic. In one or more embodiments of the species may have an atomic weight which is greater than or equal to that of antimony.

In one or more embodiments of the invention, the ion implantation process is effective to introduce damage into breakdown layer. The damage caused by the ion implantation process includes the damage left in the breakdown layer caused by the species. The damage caused by the ion implantation process may be related to the weight of the ion implant species used (for example, heavy ions may cause more damage that light ions), the energy used (for example, a larger energy may cause more damage than a lower energy), the dose of the species used (for example, a higher dose may cause more damage that a lower dose, and the dose rate of the species used (for example, a higher dose rate may lead to overlapping collision cascades within the target breakdown layer).

The damage caused in the breakdown layer by the ion implantation process may be of one or more different types of damage. For example, the damage may include the displacement of atoms within the breakdown layer. The damage may include point defects (such as vacancies and interstitials). The damage may be in the form of clusters of point defects. The damage may be in the form of trapping centers and point charges in the bulk or near the surface of the breakdown layer. The damage may be in the form of dangling bonds within the breakdown layer. As noted, the damage may exist as one or more types of damage.

In one or more embodiments of the invention the penetration depth of the damage is at least through half the thickness of the breakdown layer. In one or more embodiments of the invention the damage may penetrate the entire thickness of the breakdown layer.

In one or more embodiments of the invention, the penetration range of the implanted ions is at least through half the depth (e.g. thickness) of the breakdown layer. In one or more embodiments of the invention, the penetration range of the implanted ions is at least through the entire depth (e.g. thickness) of the breakdown layer. In one or more embodiments of the invention, the penetration range of the implanted ions may be greater than the depth (e.g. thickness) of the breakdown layer.

In one or more embodiments of the invention, the average of the concentration profile (the concentration as a function of depth) of the implanted ions occurs at least half way through the depth (e.g. thickness) of the breakdown layer. In one or more embodiments of the invention, the average of the concentration profile of the implanted ions occurs at least at the bottom of the breakdown layer. In one or more embodiments of the invention, the average of the concentration profile may occur beyond the depth (e.g. thickness) of the breakdown layer.

In one or more embodiments of the invention, the peak of the concentration profile of the implanted ions occurs at least half way through the depth (e.g. thickness) of the breakdown layer. In one or more embodiments of the invention, the peak of the concentration profile of the implanted ions occurs at least at the bottom of the breakdown layer. In one or more embodiments of the invention, the peak of the concentration profile may occur beyond the depth (e.g. thickness) of the breakdown layer.

Implant energies may be appropriately chosen to achieve the desired concentration profiles. Of course, the implant energies may vary depending upon the weight of the species used.

In one or more embodiments of the invention, the dose of the ions may be about $1E14/cm^2$ or greater. In one or more embodiments of the invention, the dose of the ions may be about $2E14/cm^2$ or greater. In one or more embodiments of the invention, the dose of the ions may be about $5E14/cm^2$ or greater. In one or more embodiments of the invention, the dose of the ions may be about $1E15/cm^2$. In one or more embodiments of the invention, the dose of the ions may be about $2E15/cm^2$ or greater. In one or more embodiments of the invention, the dose of the ions may be about $5E15/cm^2$ or greater.

Figure 7:
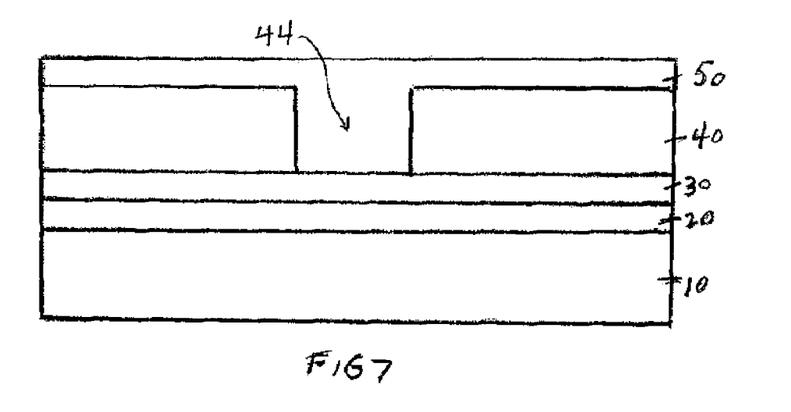

Referring to FIG. 7, after the ion implantation step is completed, a phase-change material 50 is deposited into the opening 44. The phase-change material used may be any phase-change material. An example of a phase-change material is a chalcogenide material that includes a chalcogen Periodic Table element. An example of a chalcogenide material that may be used is $Ge_2Se_2Te_5$. The phase-change material may be a non-chalcogenide phase change material.

Figure 8:
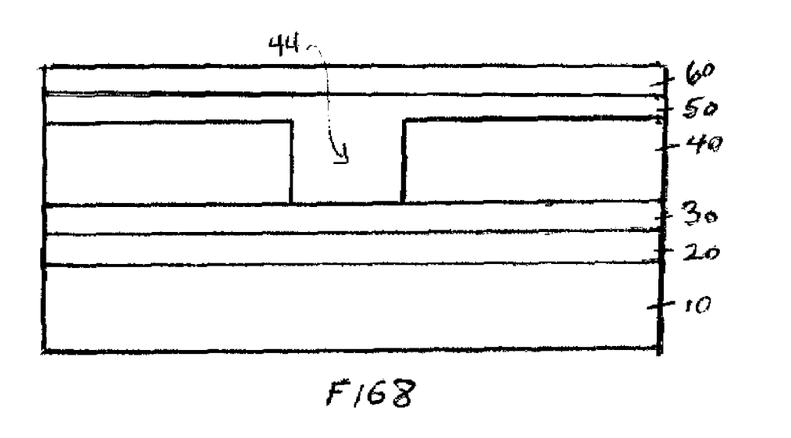

Referring to FIG. 8, a second conductive layer 60 is formed over the phase-change material. The second conductive layer 60 may be formed of any conductive material. Examples of materials which may be used for layer 60 are include, but are not limited to, n-type doped polysilicon, p-type doped polysilicon, p-type doped silicon carbon alloys and/or compounds, n-type doped silicon carbon alloys and/or compounds, titanium-tungsten, tungsten, tungsten silicide, molybdenum, and titanium nitride. Other examples include titanium carbon-nitride, titanium aluminum-nitride, titanium silicon-nitride, and carbon. The conductive layer 60 may form a second electrode for the phase-change element. The first and second conductive layers may be formed of the same conductive materials or they be formed of different conductive materials.

Figure 9:
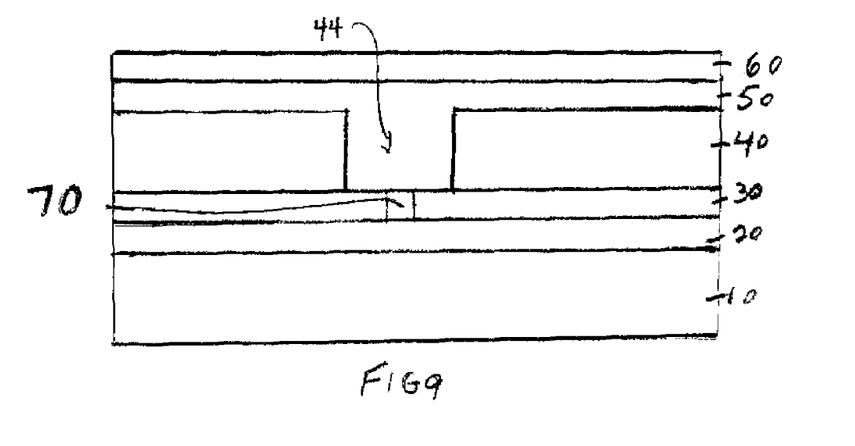

Referring to FIG. 9, a breakdown process (for example, a dielectric breakdown process) is used to create a conductive pathway 70 through the breakdown layer 30. For example, a breakdown process may occur by applying a voltage across the breakdown layer 30 which is greater than or equal to the breakdown voltage $V_B$ of the breakdown layer. While not wishing to be bound by theory, it is possible that the application of a sufficient voltage across the breakdown layer may cause a portion of the breakdown layer to break down and form a conductive pathway through the breakdown layer.

In a damaged breakdown layer, the actual break down of the material as well as the resulting conductive pathway may occur through the damaged portion of the break down layer. While not wishing to be bound by theory, it is believed that the damaged breakdown layer may break down more reliably than a non-damaged breakdown layer. It is noted that it is possible that the breakdown process may create more that one conductive pathway.

The breakdown voltage $V_B$ of the breakdown layer 30 may depend upon the composition of the breakdown layer 30 as well as the thickness of the breakdown layer. The diameter of the conductive pathway formed by the breakdown process may be determined by certain parameters, such as, for example, the voltage applied across the breakdown layer during the breakdown process, the period of time for which the voltage is applied and the amount of current passing through the breakdown layer.

The conductive pathway 70 electrically couples the conductive layer 20 and the phase-change material 50. Preferably, it is through the conductive pathway 70 that essentially all of the subsequent programming current (for example, subsequent programming cycling pulses such as set and reset pulses) may pass. That is, when subsequent programming currents are applied to the phase-change material 50, essentially all of these currents will preferably pass through the conductive pathway 70. The relatively small diameter of the conductive pathway may result in a small area of contact between the conductive pathway and the phase-change material. Hence, the programming current density may be made to be relatively high in the portion of phase-change material that is proximate the conductive pathway 70. The overall amount of programming current needed to program the phase-change element may thus be reduced. The use of a breakdown layer 30 may thus serve to reduce the amount of current needed to program the phase-change element.

Figure 10:
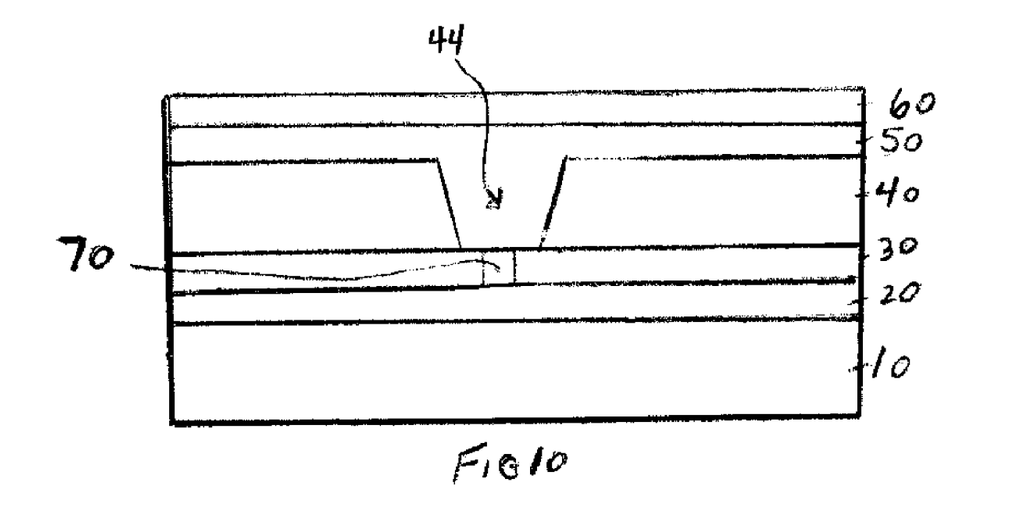
FIG. 10 is a cross-sectional view showing an embodiment of a phase-change element of the present invention.
Figure 11:
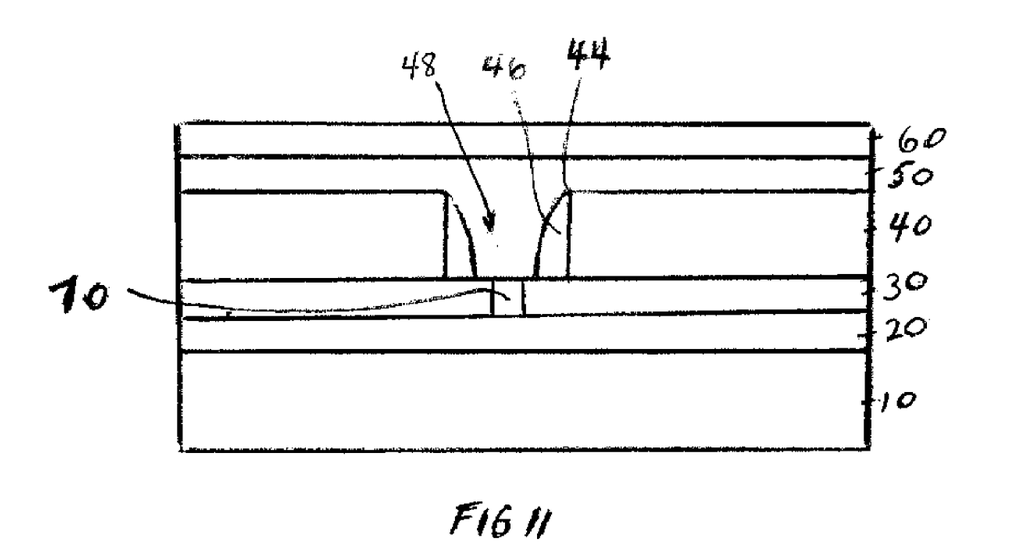
FIG. 11 is a cross-sectional view showing an embodiment of a phase-change element of the present invention.

An alternate embodiment of the invention is shown in FIG. 10. Referring to FIG. 10, it is seen that the opening 44 may be formed with tapered sidewalls. Referring to FIG. 11, it is seen that, in an alternate embodiment of the invention, it is also possible that a sidewall spacer 46 be formed on the sidewall of the opening 44 to form a narrowed opening 48. In one embodiment of the invention, the sidewall spacer 46 may be formed after the formation of the opening 44 but before the ion implantation damage process. In another embodiment of the invention, the sidewall spacer may be formed after the ion implantation damage process but before the formation of the phase-change layer 50.

Referring to the embodiments of the invention shown in FIGS. 9, 10 and 11, it is possible, in an alternate embodiment of the invention, that the breakdown layer 30 is damaged by ion implantation after the breakdown layer 30 is formed but before the dielectric layer 40 is formed.

Figure 12A:
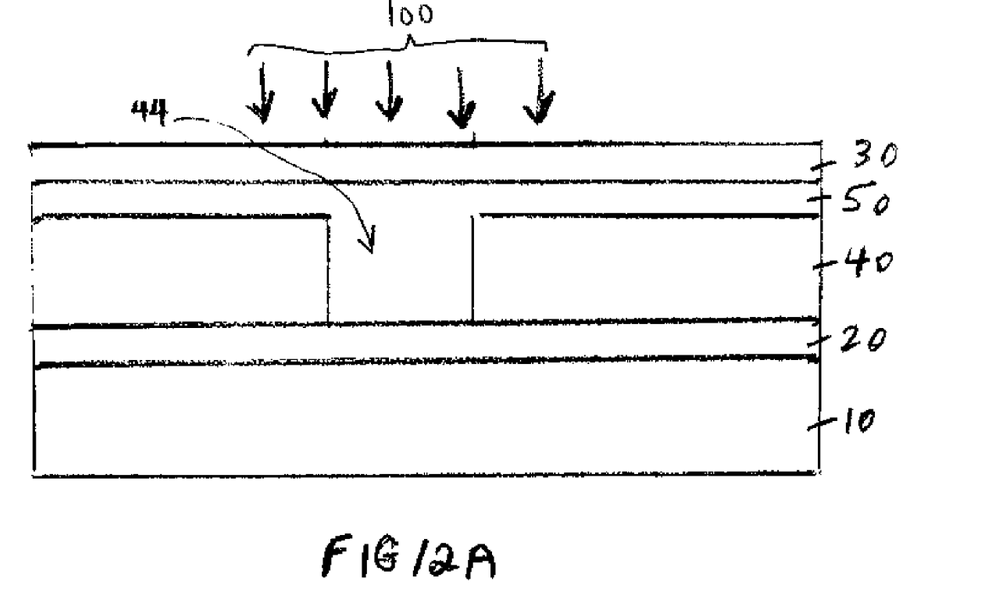
FIGS. 12A through 12B are cross-sectional views showing steps in the manufacturing of an embodiment of a phase-change element of the present invention.

FIG. 12A shows another embodiment of the present invention. In the embodiment shown in FIG. 12A, a first conductive layer 20 is formed over the substrate and a dielectric layer 40 is formed over the conductive layer 20. An opening 44 is formed in the dielectric layer 40. A phase-change material 50 is then deposited into the opening 44. A breakdown layer 30 is then deposited over the phase-change material 50. After the breakdown layer is formed, it is seen that the breakdown layer is then damaged by an ion implantation process 100.

Figure 12B:
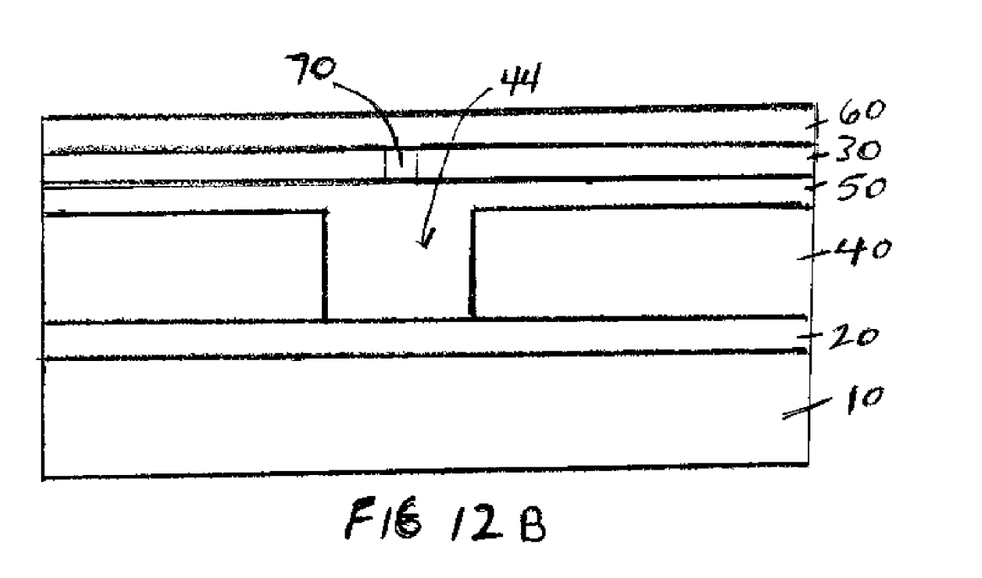

Referring to FIG. 12B, after the breakdown layer has been damaged by an ion implantation, a second conductive layer 60 is formed over the breakdown layer 30. A voltage which is greater than or equal to the breakdown voltage of the breakdown layer 30 may then be applied across the breakdown layer to create the conductive pathway 70 through the breakdown layer which electrically couples the phase-change material 50 and the conductive layer 60.

Figure 13A:
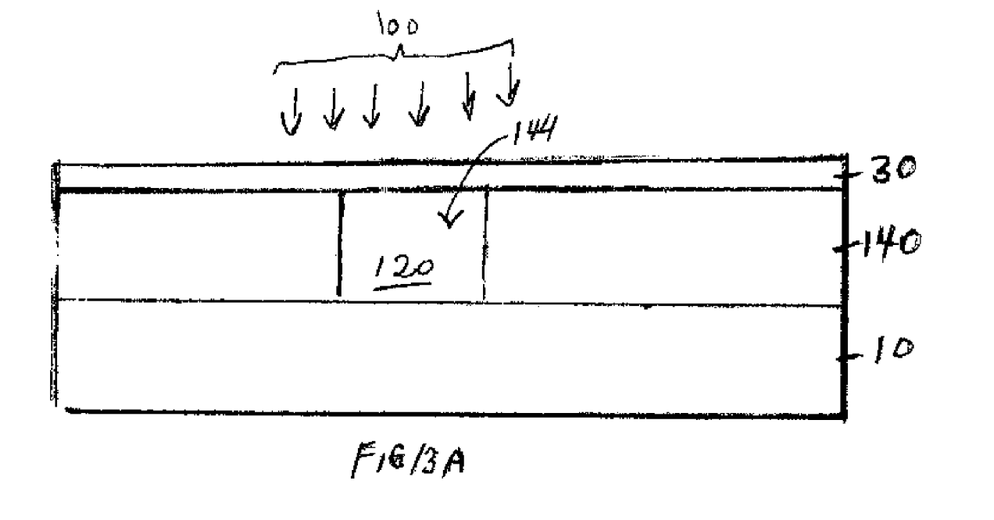
FIGS. 13A through 13B are cross-sectional views showing steps in the manufacturing of an embodiment of a phase-change element of the present invention.
Figure 13B:
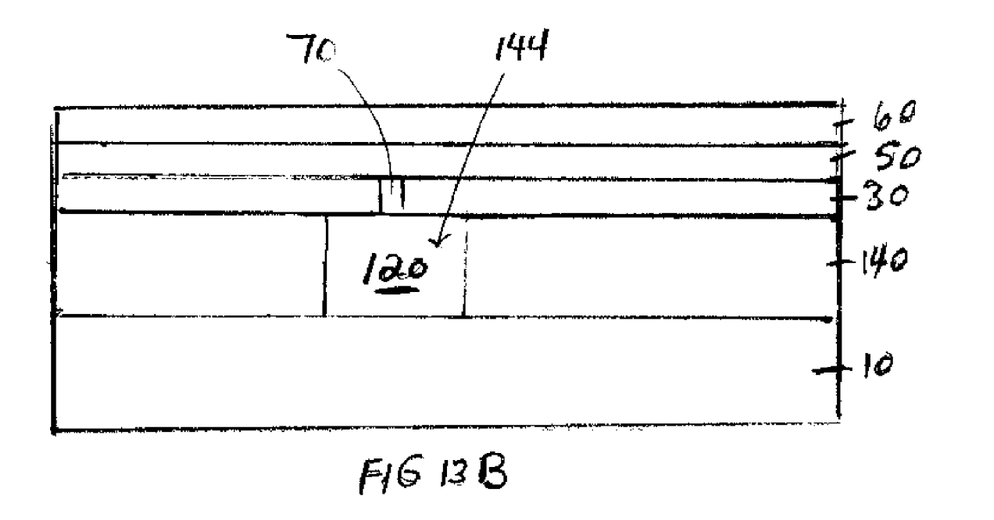

FIGS. 13A-B show the formation of another embodiment of the present invention. Referring to FIG. 13A, a dielectric layer 140 is formed over a substrate. An opening 144 is formed in the dielectric 140. A first conductive layer 120 is disposed in the opening 144 and is chemically mechanically polished. A breakdown layer 30 is deposited over the first conductive layer 144. The breakdown layer 30 is subjected to damage by an ion implantation process 100.

Referring to FIG. 13B, a phase-change material 50 is deposited over the breakdown layer and a second conductive layer is deposited over the phase-change material 50. The breakdown layer 30 is then subjected to a breakdown process to form the conductive pathway 70 through the breakdown layer 30. Of course, sidewall spacers may be placed along the sidewalls of opening 144 to form even smaller opening so as to reduce the width of the first conductive layer 120.

A plurality of the phase-change elements may be used to form an array of phase-change elements. A plurality of such phase-change elements may be placed into an array to form a programmable matrix array. Each of the phase-change elements comprises a phase-change layer in series with a breakdown layer. In one or more embodiments of the invention, a programmable matrix array of such phase-change elements may be formed using at least one (and preferably at least two) first address lines and using at least one (and preferably at least two) second address lines. In one or more embodiments of the invention, the first address lines are oriented in a first direction while the second address lines may be oriented in a second direction different from the first direction. In one or more embodiments of the invention, the first address lines may cross over the second address lines at cross-over points. The first address lines may run perpendicular to the second address lines. The first address lines may be word lines and the second address lines may be bit lines.

Figure 14:
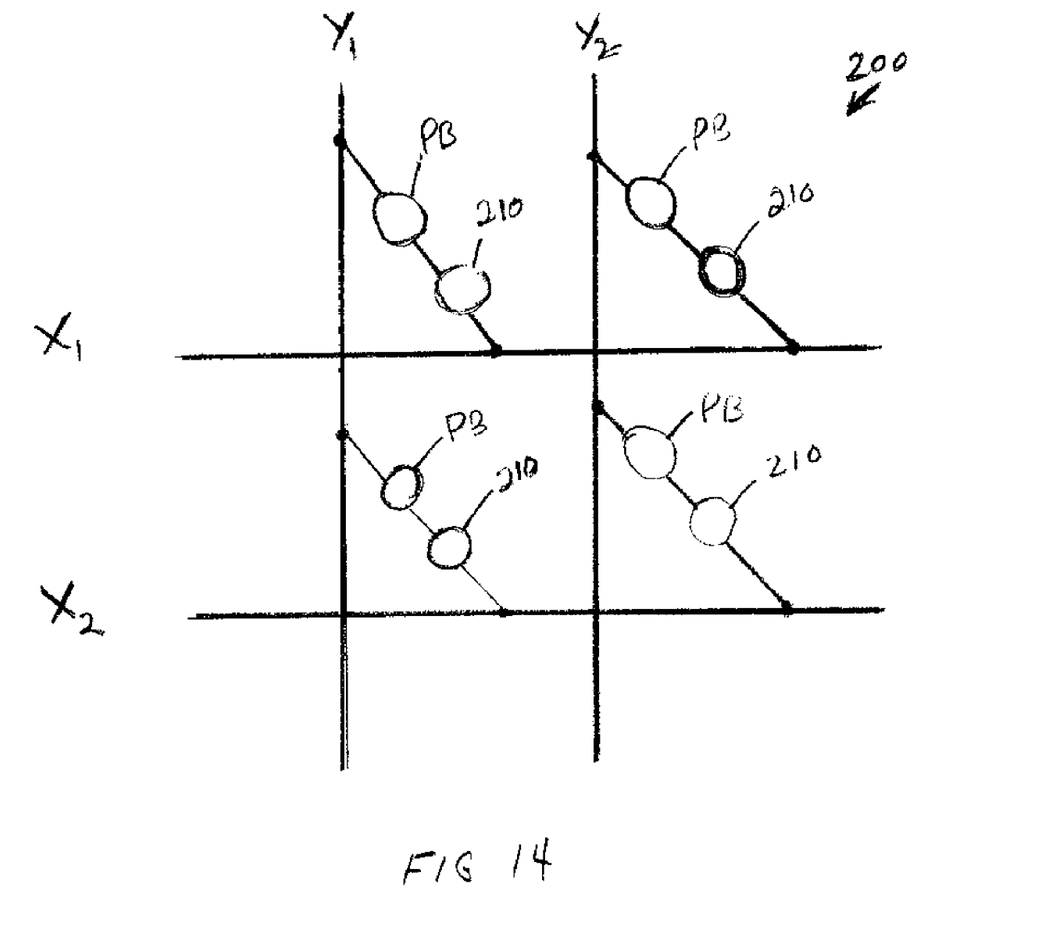
FIG. 14 is an embodiment of a programmable matrix array of the present invention including phase-change elements and isolation elements.

When forming a programmable matrix array each of the phase-change elements may be used in combination with an isolation device (also referred to in the art as a steering device). An example of an isolation device is a diode, a transistor and a threshold switch (such as an S-type threshold switch or a chalcogenide threshold switch). FIG. 14 shows a programmable matrix array 200 which is an embodiment of the present invention. The array 200 is a two by two array of a phase-change elements PB. Each of the phase-change elements PB is in series with an isolation element 210 between a corresponding first and second address line. The array 200 includes two first address lines X1, X2 and two second address lines Y1, Y2. In the example shown in FIG. 14, each of the phase-change elements PB includes a phase-change layer and a breakdown layer coupled in series between a first and second terminal of the phase-change element (and hence, the phase-change layer and the breakdown layer are also coupled in series between a corresponding first and second address line of the array). A corresponding isolation device 210 (for example, a diode, a threshold switch etc.) is coupled in series with each of the phase-change element between the corresponding first and second address lines.

Figure 15:
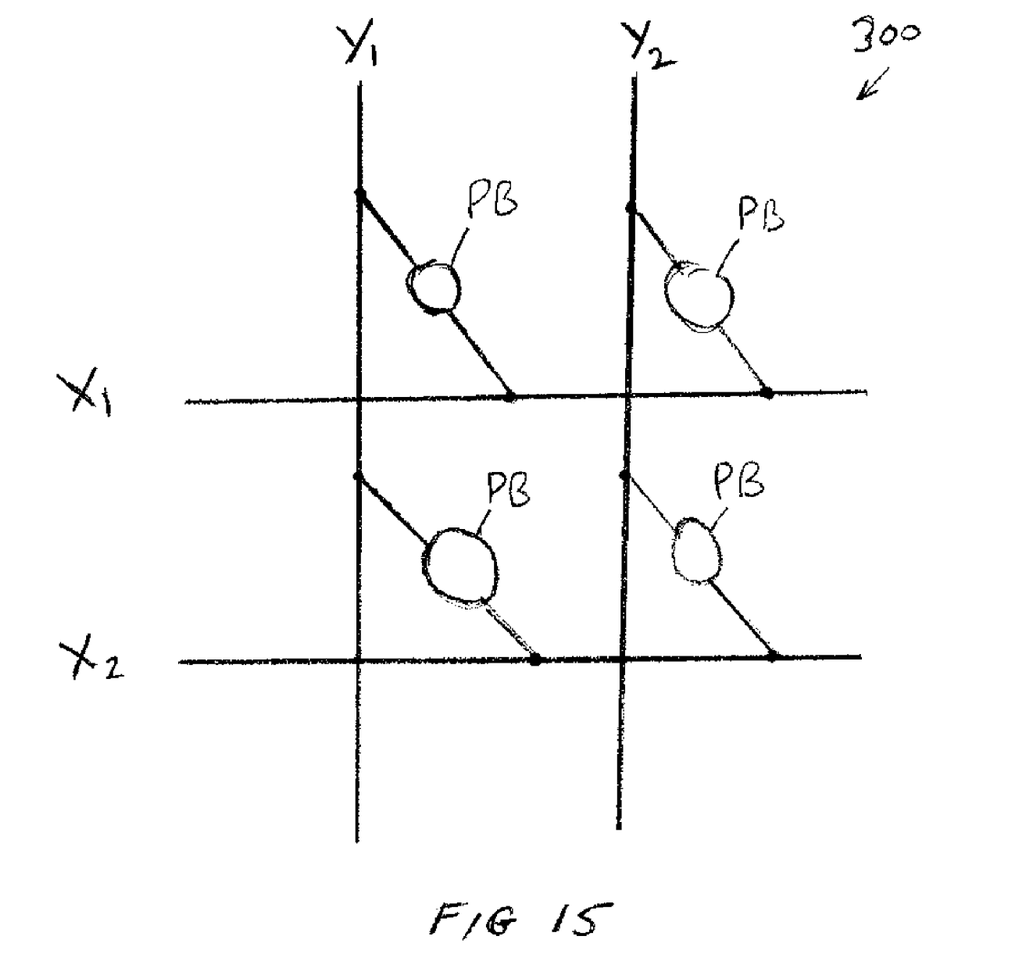
FIG. 15 is an embodiment of a programmable matrix array of the present invention including phase-change elements without isolation elements.

In an alternate embodiment of the invention, a programmable matrix array may be formed without the use of isolation elements. FIG. 15 shows a programmable matrix array 300 which is a two by two array of the phase-change elements PB coupled between corresponding first and second address lines. In this case, there is no isolation element in series with the phase-change element PB between the corresponding first and second address lines.

The programmable matrix arrays 200, 300 shown in FIGS. 14 and 15, respectively may be used as memory arrays. In this case, each of the phase-change elements PB may also be referred to as (and used as) a memory element. Memory elements and memory arrays are examples of devices of the present invention. In particular, they are examples of memory devices of the present invention.

In one or more embodiments of the invention, when used as a memory array, the breakdown layer of each of the corresponding phase-change elements of the array may be broken down so that each of the phase-change elements PB can be programmed to store information. In an alternate embodiment of the invention, it is possible that, even when used as a memory array, one or more of the breakdown layers of corresponding phase-change elements will not be broken down. This is true whether or not isolation elements are used (such as in FIG. 14) or isolation elements are not used (such as in FIG. 15). Hence, as a first example of a method of operating a memory array of the present invention, it is possible that each of the breakdown layers is broken down. As a second example of a method of operating a memory array of the present invention, it is possible that at least one of the breakdown layers is not broken down while at least one of the breakdown layers is broken down.

In addition, when used as a memory array, there are several different ways of programming the phase-change material. As a first example of operating the memory array, each of the phase-change elements PB may be programmed to store information by being electrically programmed back and forth between a generally amorphous state (for example, a high resistance or RESET state) and a generally crystalline state (for example, a low resistance or SET state). As a second example of operating the memory array, each of the phase-change element may be programmed among two or more resistance states of intermediate resistance values. Each resistance state may, for example, represent a volume fraction of amorphous material and a volume fraction of crystalline material. As a third example of operating the memory array, it may also be possible to store information within each of the phase-change elements by electrically programming the phase-change element between a first and second condition while remaining in a generally amorphous state (e.g. a relatively high resistance state).

In one or more embodiments of the invention, the programmable matrix arrays shown in either FIG. 14 or 15 may be used as a programmable matrix array for a programmable logic device. Programmable logic devices include, for example, field programmable devices which may be programmed after they are manufactured. Examples of field programmable devices include programmable ROM (PROM), electrically erasable ROM (EEPROM), field programmable logic arrays (FPLA), the programmable array logic device (PAL®), the complex programmable logic device (CPLD), and the field-programmable gate array (FPGA).

When used for programmable logic applications, each of the phase-change elements may be used as a programmable connection. For example, referring to the embodiment of the programmable array shown in FIG. 15, it is seen that the phase-change element PB may be used as a programmable connection for programmably electrically coupling a first address line (such as X1 or X2) with a corresponding second address line (such as Y1 or Y2). It is also noted that, more generally, a phase-change element may be used as a programmable connection to programmably couple a first conductive layer to a second conductive layer. Programmable connections, programmable matrix arrays and programmable logic devices are all examples of devices of the present invention.

When used as a programmable connection, a relatively low resistance between a first and second address line may represent a CLOSED connection between the lines (where it is intended that information is transmitted between the lines). A relatively high resistance between a first and second address line may represent an OPEN connection between the lines (where it is intended that information is not transmitted between the lines).

The phase-change element PB (having a phase-change material in series with a breakdown layer) may be placed in a relatively low resistance state when 1) the breakdown layer is broken down and 2) the phase-change material is in a low resistance state (for example, a generally crystalline state). Referring to the embodiment shown in FIG. 15, under these conditions, the corresponding programmable connection may be said to be in a CLOSED state.

Likewise, the phase-change element PB may be placed in a relative high resistance state when 1) the breakdown layer is not broken down or 2) the phase-change material is in a high resistance state (for example, a generally amorphous state) regardless of the state of the breakdown layer. Again, referring to the embodiment shown in FIG. 15, under such conditions, the corresponding programmable connection may be said to be in an OPEN state. Hence, when used as a programmable connection, each phase-change element PB can be placed in an OPEN state and a CLOSED state as shown in the Table below.

TABLE state of a phase-change element
as a programmable connection

| | Breakdown material broken down | breakdown material not broken down |
|---|---|---|
| phase-change material in low resistance state | CLOSED | OPEN |
| phase-change material in high resistance state | OPEN | OPEN |

After the breakdown layer is broken down, each of the phase-change elements PB may be programmed back and forth between a high resistance state (e.g. a generally amorphous state) and a low resistance state (e.g. a generally crystalline state).

When used as a programmable matrix array for a programmable logic device, the first address lines (such as X1, X2 in FIG. 15) may, for example, represent input lines for inputting signals to the programmable array while the second address lines (for example, Y1, Y2 of FIG. 15) may be output lines for outputting signals from the programmable array. The roles of the lines may, of course, be reversed so that the first address lines are the output lines while the second address lines are the input lines.

Many different methods of operation are possible when using a programmable matrix array of the present invention for programmable logic device applications. In an embodiment of the invention, each output line may have a CLOSED connection to only one input line, however, each input line may have a CLOSED connection to one or more output lines.

In another embodiment of the invention, each output line may have a CLOSED connection to only one input line, and each input line may have a CLOSED connection to only one output line. In another embodiment of the invention, each input line may have a CLOSED connection to only one output line, however, each output line may have a CLOSED connection to one or more input lines.

Figure 16:
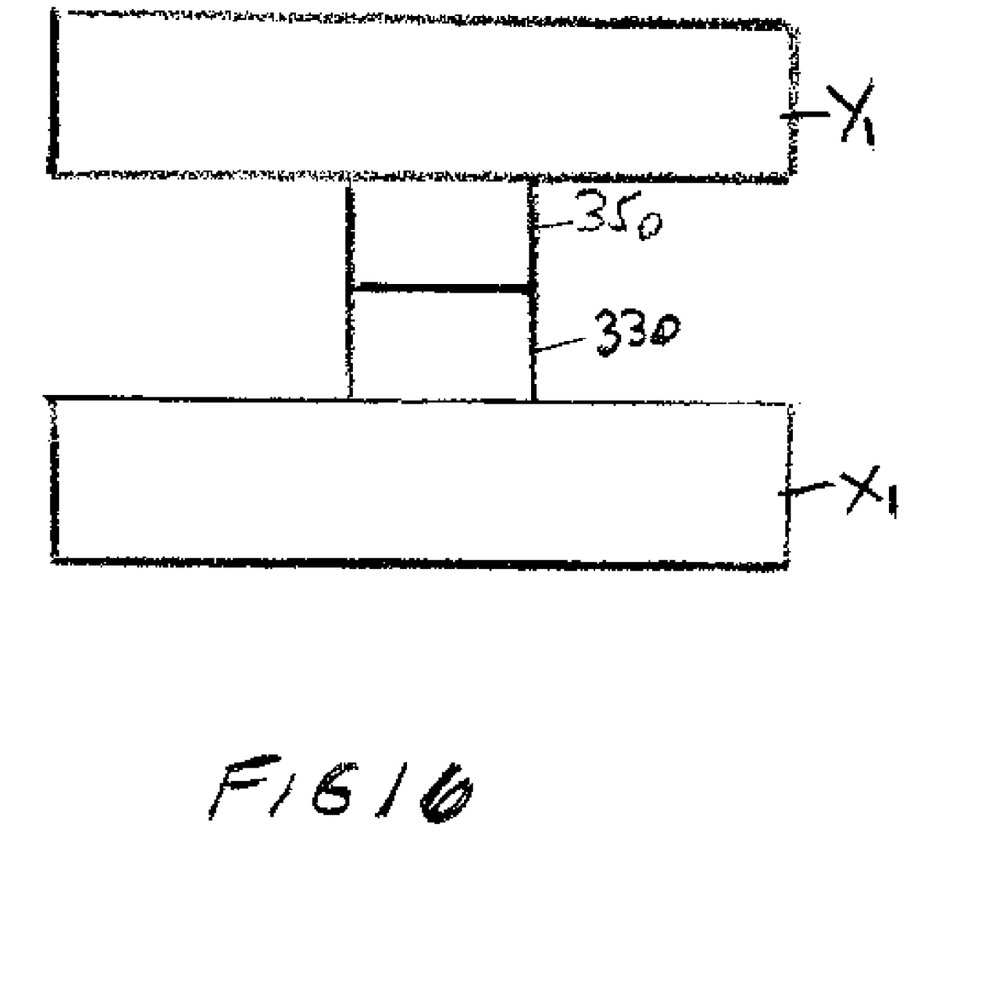
FIG. 16 shows a phase-change layer in series with a breakdown layer between a first address line and a second address line.

FIG. 16 shows an example of a phase-change element disposed between a first address line X1 and a second address line Y1. In the example shown, the phase-change element comprises a phase-change material 350 in series with a breakdown layer 330 between a first address line X1 and a second address line Y1.

Phase-change materials includes materials that are capable of being electrically programmed between a first structural state where the material is generally amorphous and a second structural state where the material is generally crystalline. The phase-change material exhibits different electrical characteristics depending upon its state. For instance, in its crystalline, more ordered state the material exhibits a lower electrical resistivity than in its amorphous, less ordered state.

Materials that may be used as a phase-change material include alloys of the elements from group VI of the Periodic Table. These group VI elements are referred to as the chalcogen elements and include the elements Te and Se. Alloys that include one or more of the chalcogen elements are referred to as chalcogenide alloys. An example of a chalcogenide alloy is the alloy $Ge_2Sb_2Te_5$.

Figure 17:
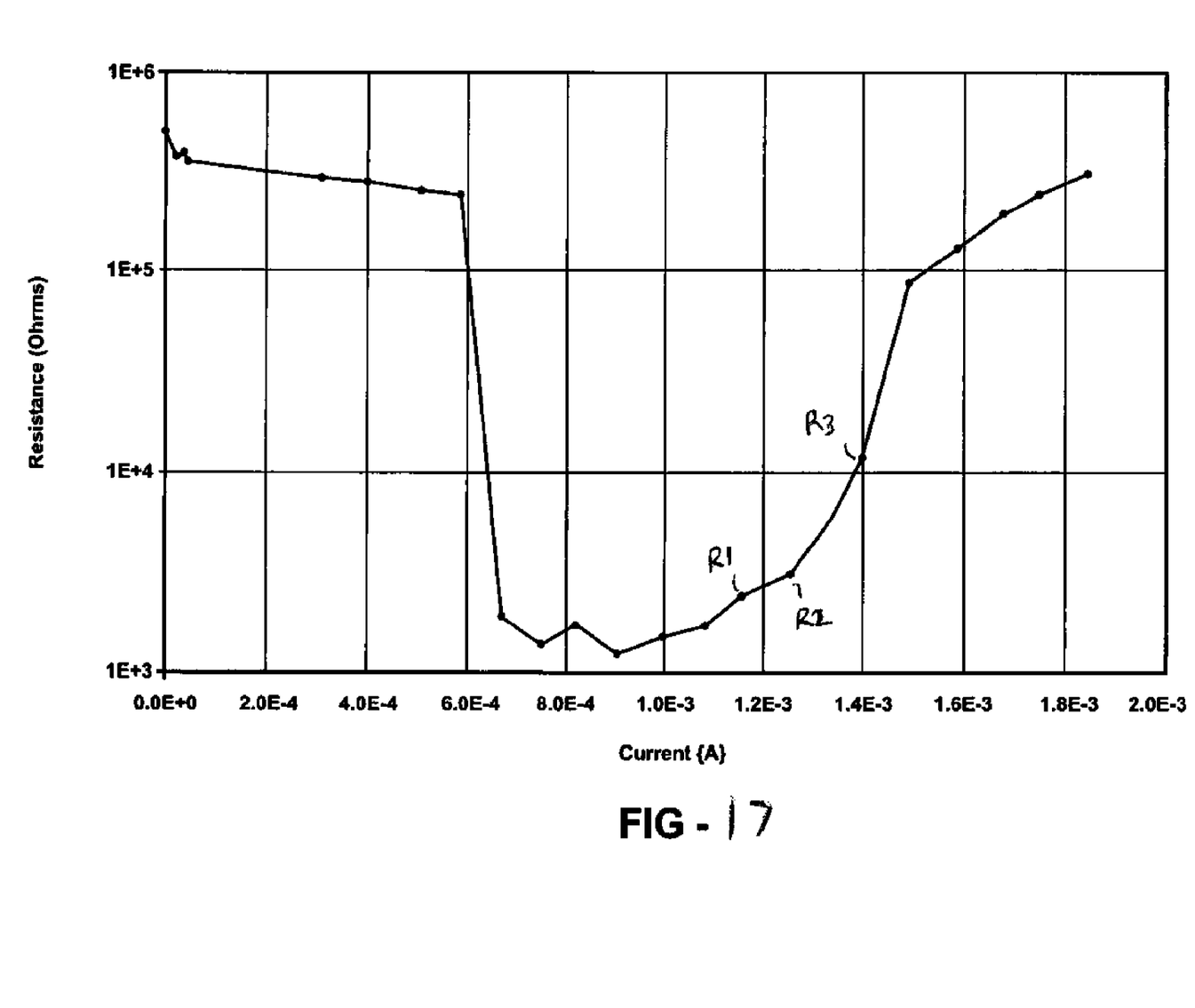
FIG. 17 is an embodiment of a current-resistance curve for a chalcogenide phase-change element.

FIG. 17 is an example of a plot of the resistance of a chalcogenide phase-change element versus the amplitude of a current pulse through the phase-change element. The phase-change element may be one without a breakdown layer or it may be one with a breakdown layer that has already been broken down.

Referring to FIG. 17, several different programming regimes can be distinguished. In the left side of the curve, the resistance of the phase-change element remains substantially constant (i.e., in its high resistance or RESET state) until a current pulse of sufficient energy is applied. The phase-change element is then transformed from its high resistance (RESET) state to its low resistance (SET) state. The current pulse sufficient to program the phase-change element from the high resistance state to the low resistance state is referred to as a "set pulse". While not wishing to be bound by theory, it is believed that the set pulse is sufficient to change at least a portion of the phase-change element from a less-ordered amorphous state to a more-ordered crystalline state.

The phase-change element may be programmed back from the low resistance state or SET state to the high resistance or RESET state by applying a current pulse of sufficient amplitude, referred to as a "reset pulse". While not wishing to be bound by theory, it is believed that application of a reset pulse to the phase-change element is sufficient to change at least a portion of the phase-change element from a more-ordered crystalline state to a less-ordered amorphous state. The phase-change element may be programmed back and forth between the high resistance or RESET state and the low resistance or SET state. This type of programming scheme provides for a binary mode of operation (for example, the RESET state may be a logic 0 while the SET state may be a logic 1).

Referring to the right side of the curve of FIG. 17, as the amplitude of the current through the phase-change element increases, the resistance of the element increases. This increase is both gradual and reversible. In this regime, the chalcogenide phase-change element may be programmed to any resistance value within a window of resistance values bounded by the low resistance or SET state and the high resistance or RESET state. More specifically, in this regime along the right side of the curve, the phase-change element may be programmed from any one of the resistance states on the right side of the resistance curve to any other of the resistance states on the right side of the curve by the application of a current pulse of sufficient amplitude. The phase-change element may also be programmed between three or more resistance values within the resistance window so as to provide for multi-state, directly overwritable data storage. While not wishing to be bound by theory, it is believed that each of the resistance states along the right side of the curve may correspond to a particular ratio of the volume of crystalline material to the volume of amorphous material in an active region of the chalcogenide material. Three intermediate resistance states R1, R2 and R3 are shown in the resistance curve of FIG. 17.

In one or more embodiments of the invention, the phase-change element may be formed from a phase-change material that is not a chalcogenide material.

In yet other embodiments of the invention, it is also possible that devices be formed from programmable resistance materials that are not phase-change materials. For example, a programmable resistance material may be any material which is programmable between at least a first resistance state and a second resistance state. The programming means may, for example, be electrical energy (such as electrical energy). However, other forms of energy, such as thermal energy and optical energy may also be used. Hence, devices (such as electronic device) may be formed by placing programmable resistance materials in series with breakdown layer between first and second conductive layers.

In one or more embodiments of the invention, the damaged breakdown layer described herein may also be used in combination with a threshold switching material. For example, the damaged breakdown layer may be placed in series with a threshold switching materials between a first conductive layer and a second conductive layer. The first and second conductive layers may, for example, each be address lines. The first and second conductive layer may, for example, each be electrodes. The breakdown layer may be used in combination (such as in series) with a threshold switching material to form a threshold switch.

Figure 18:
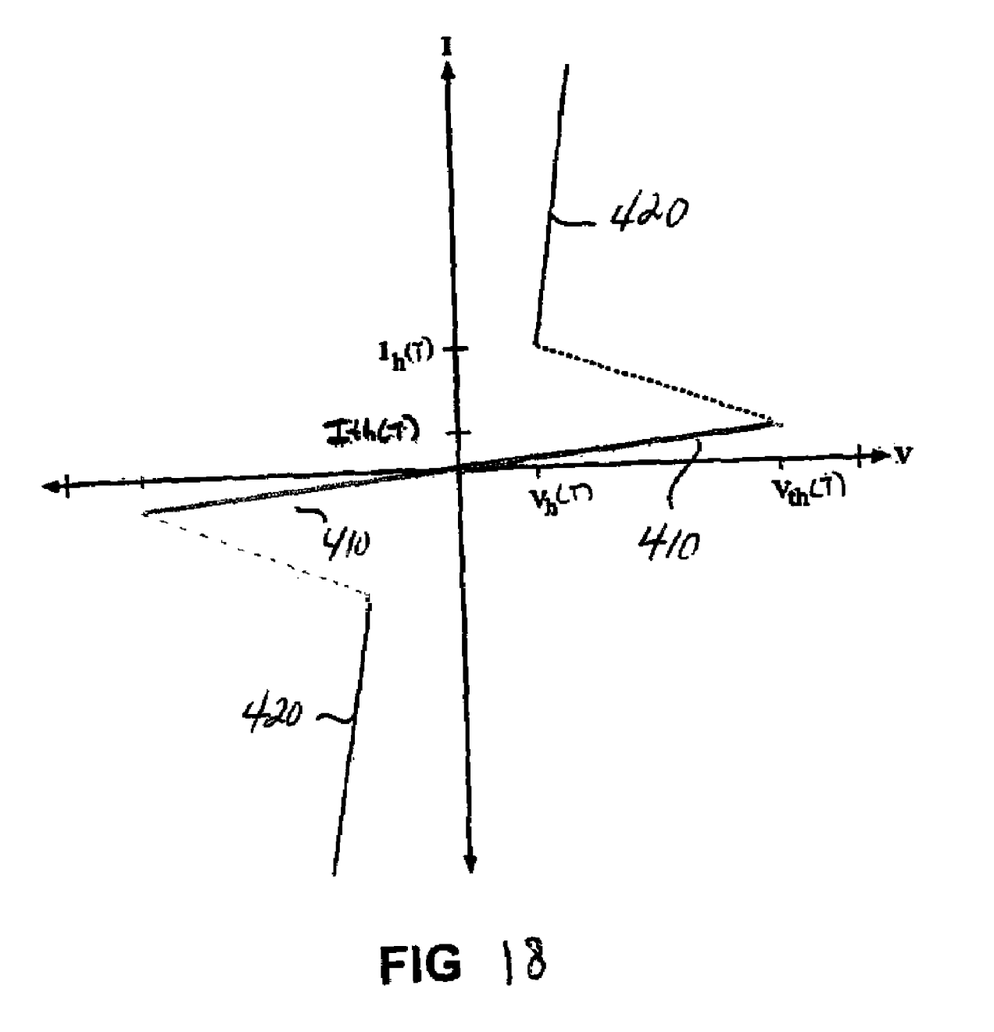
FIG. 18 is an embodiment of a current-voltage characteristic curve for a chalcogenide threshold switch.

An example of a threshold switching material is a chalcogenide threshold switching material. An example of an I-V characteristic curve for a two terminal chalcogenide threshold switch comprising a volume of chalcogenide threshold switching material sandwiched between two electrodes is shown in FIG. 18. FIG. 18 may also represent an example of the current-voltage characteristics of the chalcogenide threshold switch that also includes a breakdown layer (in series with the chalcogenide threshold switching material) that has already been broken down.

FIG. 18 shows the I-V plot in both the first quadrant (where voltages and currents are positive) and the third quadrant (where voltages and currents are negative). While only the first quadrant is described below, an analogous description applies to the curve in the third quadrant of the I-V plot (where the voltage and the current are both negative). The threshold voltage of threshold switch is referred to as $V_{th}(T)$, the threshold current as $I_{th}(T)$, the holding voltage as $V_h(T)$, the holding current of the switch as $I_h(T)$.

The I-V characteristic curve IV includes an "off-state" branch 410 and an "on-state" branch 420. When the switch operates on the off-state branch, it is in its OFF state. When the switch operates on the on-state branch 420, the switch is in its ON state. The resistance of the switch is lower in its ON state than in its OFF state. The slopes of the off-state and on-state branches shown in FIG. 17 (and hence the resistances of the OFF and ON states, respectively) are illustrative and not intended to be limiting.

Referring to FIG. 18, when no voltage is applied across the switch, the switch is in the OFF state and no current flows. The threshold switch remains in its OFF state as the voltage across the threshold switch and the current through the threshold switch is increased, up to a voltage $V_{th}(T)$ which is referred to as the threshold voltage of the threshold switch. When the applied voltage across the threshold switch equals or exceeds the threshold voltage $V_{th}(T)$, the threshold switch switches from the off-state branch 410 to the on-state branch 420 of the I-V curve, the switch switches from its OFF state to its ON state. The switching event is depicted by the dashed line in FIG. 18. Upon switching and depending upon the load impedance between the forced voltage and the threshold switch, the voltage across the threshold switch may decrease significantly and the current through the threshold switch may increase significantly. The voltage across the threshold switch may drop ("snapback") to a holding voltage $V_h(T)$ which is less than the threshold voltage $V_{th}(T)$. The difference between the threshold voltage $V_{th}(T)$ and the holding voltage $V_h(T)$ is referred to as the snapback voltage.

The threshold switch remains in its ON state (on the on-state branch 420) as long as a minimum current, called the holding current $I_h(T)$, is maintained (the associated voltage $V_h(T)$ is referred to as the holding voltage). If the current through the switch drops below $I_h(T)$, the threshold switch normally returns to the off-state branch 410 and requires re-application of a voltage across the switch greater than or equal to the threshold voltage $V_{th}(T)$ to resume operation on the on-state branch.

Analogous switching behavior occurs in the third quadrant of the I-V plot shown in FIG. 18. Provided one is aware of the negative polarities of both the voltage and current of the I-V curve in the third quadrant, the switching behavior in the third quadrant is analogous to that described hereinabove for the first quadrant.

A chalcogenide threshold switching material may be in an amorphous state and may remain in an amorphous state regardless of the energy applied. A chalcogenide threshold switching material may not readily crystallize and may not readily change its structural state with application of electrical energy. Certain embodiments of chalcogenide threshold switching materials may not change structural states regardless of the current applied. In one or more embodiments of the invention, a threshold switching material may not be a phase-change material. In one or more embodiments of the invention, a threshold switching material may not be a programmable material.

The I-V characteristic curve shown in FIG. 18 is an example of an S-type I-V curve. Any threshold switching material satisfying this type of characteristic is referred to as an S-type threshold switching material and may be used in the present invention. The threshold switching material need not be a chalcogenide material. Likewise, the present invention may also be applicable to threshold switching materials which are not S-type materials.

While the present invention has been described with respect to a limited number of embodiments, those skilled in the art will appreciate numerous modifications and variations thereof. It is intended that the appended claims cover all such modifications and variations as fall within the true spirit and scope of this present invention.

We claim:

1. A method, comprising:
   forming a conductive material;

forming a phase-change material;
forming a breakdown layer, said breakdown layer being between said conductive material and said phase-change material; and
uniformly ion implanting said breakdown layer.

2. The method of claim 1, further comprising, after said ion implanting, creating a conductive pathway through said breakdown layer using a breakdown process, said conductive pathway electrically coupling said phase-change material and said conductive material.

3. The method of claim 1, wherein said breakdown layer is formed over said conductive material, and wherein and said phase-change material is formed over said breakdown layer after said breakdown layer is ion implanted.

4. The method of claim 1, wherein said breakdown layer is formed over said phase-change material, and wherein and said conductive material is formed over said breakdown layer after said breakdown layer is ion implanted.

5. The method of claim 1, wherein said phase-change material comprises a chalcogenide material.

6. The method of claim 1, wherein said breakdown layer is a dielectric layer.

7. A method, comprising:
forming a conductive material;
forming a threshold switching material, said threshold switching material not being a phase-change material;
forming a breakdown layer, said breakdown layer being between said conductive material and said threshold switching material; and
ion implanting said breakdown layer.

8. The method of claim 7, further comprising, after said ion implanting, creating a conductive pathway through said breakdown layer using a breakdown process, said conductive pathway electrically coupling said threshold switching material and said conductive material.

9. The method of claim 7, wherein said breakdown layer is formed over said conductive material, and wherein and said threshold switching material is formed over said breakdown layer after said breakdown layer is ion implanted.

10. The method of claim 7, wherein said breakdown layer is formed over said threshold switching material, and wherein and said conductive material is formed over said breakdown layer after said breakdown layer is ion implanted.

11. The method of claim 7, wherein said threshold switching material is a chalcogenide material.

12. The method of claim 7, wherein said breakdown layer is a dielectric layer.

13. The method of claim 7, wherein said ion implanting is uniformly ion implanting.

14. A device, comprising:
a conductive layer;
a programmable resistance material; and
a breakdown layer between said conductive layer and said programmable resistance material, said breakdown layer being uniformly ion implanted.

15. The device of claim 14, wherein said breakdown layer includes an electrically conductive pathway electrically coupling said conductive layer and said programmable resistance material, said conductive pathway caused by a breakdown process.

16. The device of claim 14, wherein said programmable resistance material comprises a chalcogenide material.

17. The device of claim 14, wherein said breakdown layer is a dielectric layer.

18. The device of claim 14, wherein said device is a memory device.

19. The device of claim 14, wherein said device is a programmable logic device.

20. The device of claim 14, wherein said programmable resistance material comprises a phase-change material.

21. The device of claim 20, wherein said phase-change material comprises a chalcogenide material.

22. A device, comprising:
a conductive layer;
a threshold switching material, said threshold switching material not being a phase-change material; and
a breakdown layer between said threshold switching material and said second conductive layer, said breakdown layer being ion implanted.

23. The device of claim 22, wherein said dielectric layer includes an electrically conductive pathway electrically coupling said conductive layer and said threshold switching material, said conductive pathway caused by a breakdown process.

24. The device of claim 22, wherein said threshold switching material is an S-type material.

25. The device of claim 22, wherein said threshold switching material is a chalcogenide material.

26. The device of claim 22, wherein said breakdown layer is a dielectric layer.

27. The method of claim 22, wherein said breakdown layer is uniformly ion implanted.

28. A method of making a semiconductor device, comprising:
forming a conductive material;
forming a programmable resistance material;
forming a breakdown layer, said breakdown layer being between said conductive material and said programmable resistance material; and
ion implanting said breakdown layer, said ion implanting being perpendicular to a semiconductor substrate of said device.

29. The method of claim 28, further comprising, after said ion implanting, creating a conductive pathway through said breakdown layer using a breakdown process, said conductive pathway electrically coupling said phase-change material and said conductive material.

30. The method of claim 28, wherein said breakdown layer is formed over said conductive material, and wherein and said programmable resistance material is formed over said breakdown layer after said breakdown layer is ion implanted.

31. The method of claim 28, wherein said breakdown layer is formed over said programmable resistance material, and wherein and said conductive material is formed over said breakdown layer after said breakdown layer is ion implanted.

32. The method of claim 28, wherein said programmable resistance material comprises a chalcogenide material.

33. The method of claim 28, wherein said programmable resistance material comprises a phase-change material.

34. The method of claim 33, wherein said phase-change material comprises a chalcogenide material.

35. The method of claim 28, wherein said breakdown layer is a dielectric layer.

36. A method of making a semiconductor device, comprising:
forming a conductive material;
forming a programmable resistance material;
forming a breakdown layer, said breakdown layer being between said conductive material and said programmable resistance material; and
uniformly increasing the reliability of breakdown of said breakdown layer.

37. The method of claim 36, further comprising, after increasing said reliability, creating a conductive pathway through said breakdown layer using a breakdown process, said conductive pathway electrically coupling said phase-change material and said conductive material.

38. The method of claim 36, wherein said breakdown layer is formed over said conductive material, and wherein and said programmable resistance material is formed over said breakdown layer after said reliability is increase.

39. The method of claim 36, wherein said breakdown layer is formed over said programmable resistance material, and wherein and said conductive material is formed over said breakdown layer after said reliability is increased.

40. The method of claim 36, wherein said programmable resistance material comprises a chalcogenide material.

41. The method of claim 36, wherein said programmable resistance material comprises a phase-change material.

42. The method of claim 41 wherein said phase-change material comprises a chalcogenide material.

43. The method of claim 36, wherein said breakdown layer is a dielectric layer.

44. The method of claim 36, wherein said uniformly increasing the reliability comprises ion implanting said breakdown layer.

* * * * *